US008609237B2

(12) United States Patent
Kelly

(10) Patent No.: US 8,609,237 B2
(45) Date of Patent: *Dec. 17, 2013

(54) COMPOSITE MATERIALS AND METHODS OF MAKING THE SAME

(75) Inventor: Michael DeWayne Kelly, North Wales, PA (US)

(73) Assignee: Rohm and Haas Company, Philadelphia, PA (US)

( * ) Notice: Subject to any disclaimer, the term of this patent is extended or adjusted under 35 U.S.C. 154(b) by 728 days.

This patent is subject to a terminal disclaimer.

(21) Appl. No.: 12/313,729

(22) Filed: Nov. 24, 2008

(65) Prior Publication Data

US 2009/0169867 A1    Jul. 2, 2009

Related U.S. Application Data

(60) Provisional application No. 61/130,806, filed on Jun. 3, 2008, provisional application No. 61/009,134, filed on Dec. 26, 2007.

(51) Int. Cl.
*B32B 5/16* (2006.01)

(52) U.S. Cl.
USPC ........ 428/323; 427/385.5; 442/164; 442/173; 442/180

(58) Field of Classification Search
USPC ........ 428/323; 427/385.5; 442/164, 172, 173, 442/180; 52/309.13, 506.01
See application file for complete search history.

(56) References Cited

U.S. PATENT DOCUMENTS

| | | | |
|---|---|---|---|
| 4,076,917 A | 2/1978 | Swift et al. | |
| 5,026,746 A | 6/1991 | Floyd et al. | |
| 5,334,648 A | 8/1994 | Drews et al. | |
| 5,661,213 A * | 8/1997 | Arkens et al. | 524/555 |
| 5,895,804 A | 4/1999 | Lee et al. | |
| 6,197,863 B1 * | 3/2001 | Eck et al. | 524/430 |
| 6,291,559 B1 * | 9/2001 | Krinski et al. | 524/17 |
| 6,299,936 B1 * | 10/2001 | Reck et al. | 427/212 |
| 6,310,136 B1 | 10/2001 | Wang et al. | |
| 6,497,760 B2 | 12/2002 | Sun et al. | |
| 6,518,387 B2 * | 2/2003 | Kuo et al. | 527/100 |
| 6,569,939 B2 * | 5/2003 | Eck et al. | 524/588 |
| 6,632,925 B1 * | 10/2003 | Zhang et al. | 530/370 |
| 6,719,882 B2 | 4/2004 | Vijayendran et al. | |
| 6,790,271 B2 * | 9/2004 | Thames et al. | 106/148.1 |
| 7,026,390 B2 | 4/2006 | O'Brien-Bemini et al. | |
| 7,416,598 B2 | 8/2008 | Sun et al. | |
| 2005/0070186 A1 * | 3/2005 | Shoemake et al. | 442/176 |
| 2005/0222358 A1 | 10/2005 | Wescott et al. | |
| 2005/0261404 A1 | 11/2005 | Rivers et al. | |
| 2006/0029786 A1 | 2/2006 | Wang et al. | |
| 2006/0142433 A1 * | 6/2006 | Rivers et al. | 524/17 |
| 2006/0174801 A1 * | 8/2006 | Gagnon et al. | 106/124.1 |
| 2006/0231968 A1 * | 10/2006 | Cowan et al. | 264/109 |
| 2006/0264135 A1 * | 11/2006 | Netravali et al. | 442/123 |
| 2007/0012414 A1 | 1/2007 | Kajander et al. | |
| 2007/0059513 A1 | 3/2007 | Yu et al. | |
| 2007/0148339 A1 | 6/2007 | Wescott et al. | |
| 2007/0148430 A1 | 6/2007 | Agrawal | |
| 2008/0021187 A1 | 1/2008 | Wescott et al. | |
| 2008/0051539 A1 | 2/2008 | Kelly | |
| 2008/0090939 A1 * | 4/2008 | Netravali et al. | 523/124 |

FOREIGN PATENT DOCUMENTS

EP    1801278 A1    6/2007
WO    WO 2006/047651 A    5/2006

OTHER PUBLICATIONS

Green, ed., Perry's Chemical Engineers' Handbook, McGraw-Hill, 7th ed. 1997, p. 19-20.*
L. Jong, Characterization of Defatted Soy Flour and Elastomer Composites, Journal of Applied Polymer Science, vol. 98, 353-361 (2005).

* cited by examiner

*Primary Examiner* — Humera Sheikh
*Assistant Examiner* — Scott R Walshon
(74) *Attorney, Agent, or Firm* — Andrew E. C. Merriam

(57) ABSTRACT

The present invention provides composite materials that contain formaldehyde-free aqueous binder compositions comprising defatted soy flour of no greater than 43 micron mesh particle size and polymer particles of at least one emulsion (co)polymer. Preferably, the defatted soy flour is present as an aqueous dispersion, or is in denatured form. Also provided are methods of making and using composite materials containing the formaldehyde-free binder compositions.

11 Claims, No Drawings

COMPOSITE MATERIALS AND METHODS OF MAKING THE SAME

This application claims priority from each of U.S. Provisional Application 61/130,806, filed on Jun. 3, 2008 and 61/009,134, filed on Dec. 26, 2007.

The present invention relates to composite materials and methods of making the same. In particular, the present invention relates to flexible composite materials with aqueous formaldehyde-free binder compositions comprising defatted soy flour as the major component and one or more emulsion (co)polymer, such as, for example, for use in glass mats for roofing shingles, and methods for making the same.

The preparation of composite materials, for example, fiber structures (e.g., non-woven fiber insulation) and shaped articles (e.g., fiberboard and chipboard) are conventionally made using urea-formaldehyde (UF) resins, phenol-formaldehyde (PF) resins, or phenol-formaldehyde resins extended with urea (PFU). Commercial binders have generally been designed to afford a binder that when cured is substantially rigid. For example, in fiberglass insulation binders, the cured binder allows the insulation to be compressed, but have rigidity that allows the compressed insulation to recover substantially to its original shape once compressive forces are removed. Accordingly, the insulation may be shipped in a rolled, compressed state and unrolled before installation to release the compression, and allow a fluffy, heat-insulating mat to be installed. Fiberglass non-wovens made with a binder consisting essentially of an amino resin, most commonly a urea formaldehyde resin, often are brittle. Moreover, the strength properties of the mats may deteriorate appreciably subsequent to their preparation, especially when the mats are subjected to wet conditions. For other applications, known rigid binders are undesirable. For thin fiberglass or polyester mats for use in roofing, the mats are held together with a binder that allows the mat to flex substantially after the binder is cured, and allows the end product containing the mat to flex well in use. For example, in roofing mat, the end roofing product may be impregnated or layered with asphaltic materials, and the resultant roofing product must retain flexibility to allow it to conform to the roof (e.g., bend over peaks and into valleys), and to allow the roofing material to expand and contract with temperature fluctuations, without the mat itself fracturing because it is too brittle and lacks flexibility. For this reason, UF resin binders have, on occasion, been modified by formulating the UF resin with cross-linkers and various catalyst systems or by fortifying the UF resin with latex (emulsion) polymer. Flexible glass mats of this type may find use in a variety of applications, including roofing, flooring underlayments, filtration media, and building products. However, in view of the toxicity of formaldehyde, which is a possible carcinogen, curable compositions containing little or no formaldehyde are now desired.

Existing commercial formaldehyde-free binders used in composite materials contain a carboxylic acid polymer and a polyol that esterify and form a rigid thermoset when heat cured. However, these binders are not well suited to applications that require some flexibility.

Natural products have previously been used including soy-based binders used in wood composite structures. Soy isolate or soy concentrate were used because these highly processed forms are largely water soluble under proper pH conditions. However, both are prohibitively expensive and have failed to gain any widespread use as binders for composite materials. Further, whole ground soy bean and defatted soy flour are insoluble in water and difficult to work with.

Composites of defatted soy flour or soy protein isolate with styrene-butadiene latex are disclosed in "Characterization of Defatted Soy Flour and Elastomer Composites", L. Jong, Journal of Applied Polymer Science, Vol. 98, 353-361 (2005). L. Jong compares defatted soy flour with soy protein isolate when soy is blended into styrene-butadiene rubber at 10%, 20% and 30% levels in studying the effect of soy as a minor component filler in styrene-butadiene rubbers.

U.S. Patent Application Publication No. 2008/0051539, to Kelly, discloses curable binder compositions comprising at least one polycarboxy emulsion copolymer, at least one hydroxyamide crosslinker having at least two hydroxy groups, and at least one extender selected from the group consisting of a polysaccharide or a vegetable protein or mixtures thereof. Kelly discloses that vegetable protein can comprise defatted soy flour. However, the binder compositions disclosed in Kelly would be less suitable for composite materials of the present invention because, at suitable formulation solids levels of 10-25%, or higher, the hydroxyamides raise the viscosity of soy-based binders which may result in poor application during wet-laid mat formation, producing tracks, streaks, or low binder weight (LOI).

The inventor has endeavored to find a solution to the problem of providing composite materials reinforced with an inexpensive, formaldehyde-free, thermoset binder that retains both flexibility and strength after cure.

STATEMENT OF INVENTION

The present invention provides composite materials comprising: (a) a substrate material; and, (b) a cured or dried binder composition produced from an aqueous binder composition of i) polymer particles of at least one emulsion (co) polymer, and ii) defatted soy flour of no greater than 43 micron mesh particle size; wherein the composite material comprises ≤40 wt. % cured or dried binder composition; and, further wherein the binder composition comprises from 51 wt. % to 95 wt. % defatted soy flour, based on the binder composition solids, as well as methods for making the same.

In one embodiment of the invention, the binder composition comprises from more than 70 wt. % to 95 wt. % defatted soy flour, based on the binder composition solids.

In another embodiment of the invention, the emulsion (co) polymer comprises, in polymerized form, from 5% to 25% by weight, based on the weight of the (co)polymer, of one or more carboxy acid monomer, or anhydride thereof, or salt thereof.

In yet another embodiment of the invention, the emulsion (co)polymer is comprised of from 0.1 to 5 weight percent, based on the weight of the copolymer, of one or more multi-ethylenically unsaturated monomer, in polymerized form.

In yet still another embodiment of the invention, the multi-ethylenically unsaturated monomer comprises allylmethacrylate.

In yet still further another embodiment of the invention, the defatted soy flour is denatured. In another embodiment of the invention, the defatted soy flour is in the form of an aqueous dispersion.

In a different embodiment of the invention, the aqueous binder composition further comprises lignin or derivatives thereof, such as lignosulfonate.

In another different embodiment of the invention, the aqueous binder composition further includes one or more crosslinking agent consisting essentially of glycerol, glycerol derivatives, diethanolamine, triethanolamine, pentaerythritol, hydroxy alkyl urea, urea, oxazoline, polyvinyl alcohol, metal ions, such as ions of zirconium or zinc, and mixtures thereof.

In yet another different embodiment of the invention, the substrate material is selected from the group consisting of: polyester mat, glass reinforcing mat, or microglass based substrate material.

In another aspect, the present invention provides methods for producing a composite material, said method comprising: i) treating a substrate with a binder composition, ii) removing excess binder composition from the substrate, and iii) curing or drying the binder composition on the substrate; wherein the binder composition comprises: a) polymer particles of at least one emulsion (co)polymer, and b) defatted soy flour of no greater than 43 micron mesh particle size; and, wherein the composite material comprises ≤40 wt. % cured or dried binder composition; and wherein the binder composition comprises from 51 wt. % to 95 wt. % defatted soy flour, based on the binder composition solids.

In yet another aspect, the present invention provides composite materials in applications selected from the group consisting of: roofing, flooring, window treatments, ceiling tiles, wall coverings, roving, printed circuit boards, battery separators, filter stock, tape stock, composite facers, and reinforcement scrim for cementitious or non-cementitious masonry coatings.

In yet still another aspect, the present invention provides composite materials comprising: (a) a substrate material; and, (b) a cured or dried binder composition produced from an aqueous binder composition consisting essentially of: i) polymer particles of at least one emulsion (co)polymer, and ii) defatted soy flour of no greater than 43 micron mesh particle size; wherein the composite material comprises ≤40 wt. % cured or dried binder composition; and, further wherein the binder composition comprises from 51 wt. % to 95 wt. % defatted soy flour, based on the binder composition solids.

This invention provides flexible formaldehyde-free composites for use in, for example, fiberglass or polyester mats for roofing shingles.

Unless otherwise indicated, any term containing parentheses refers, alternatively, to the whole term as if no parentheses were present and the term without them, and combinations of each alternative. Thus, the term (co)polymer refers to a homopolymer or copolymer. Further, (meth)acrylic refers to any of acrylic, methacrylic, and mixtures thereof.

As used herein, unless otherwise indicated, the phrase "molecular weight" refers to the weight average molecular weight (Mw) of a polymer as measured by gel permeation chromatography (GPC). The system is calibrated with standards of known molecular weight and composition to correlate elution time with molecular weight. The techniques of GPC are discussed in detail in Modern Size Exclusion Chromatography, W. W. Yau, J. J Kirkland, D. D. Bly; Wiley-Interscience, 1979, and in A Guide to Materials Characterization and Chemical Analysis, J. P. Sibilia; VCH, 1988, p. 81-84. Unless otherwise indicated, molecular weights for the water soluble (co)polymers are measured using polyacrylic acid standards known in the art, and molecular weights for emulsion copolymers are measured using polystyrene standards. The molecular weights reported herein for Mw are in daltons.

As used herein, the phrase "alkyl" means any aliphatic alkyl group having one or more carbon atoms, the alkyl group including n-alkyl, s-alkyl, i-alkyl, t-alkyl groups or cyclic aliphatics containing one or more 5, 6 or seven member ring structures.

The term "unsaturated carboxylic acid monomers" or "carboxy acid monomers" includes, for example, (meth)acrylic acid, crotonic acid, itaconic acid, 2-methyl itaconic acid, α,β-methylene glutaric acid, monoalkyl fumarates, maleic monomers; anhydrides thereof and mixtures thereof. Maleic monomers include, for example, maleic acid, 2-methyl maleic acid, monoalkyl maleates, and maleic anhydride, and substituted versions thereof.

The term "unsaturated sulfonic acid monomers" includes, for example, 2-(meth)acrylamido-2-methylpropanesulfonic acid and para-styrene sulfonic acid.

As used herein, the phrase "aqueous" or "aqueous solvent" includes water and mixtures composed substantially of water and water-miscible solvents.

As used herein, "wt %", "wt. %" or "wt. percent" means weight percent.

As used herein, the phrase "based on the total weight of binder solids" refers to weight amounts of any given ingredient in comparison to the total weight amount of all the non-water ingredients in the binder (e.g., emulsion copolymers, defatted soy binder, soluble polyacids, and the like).

As used herein, unless otherwise indicated, the word "copolymer" includes, independently, copolymers, terpolymers, block copolymers, segmented copolymers, graft copolymers, and any mixture or combination thereof.

As used herein, the phrase "formaldehyde-free composition" refers to compositions substantially free from added formaldehyde, and which do not liberate substantial formaldehyde as a result of drying and/or curing.

As used herein, the phrases "$(C_3-C_{12})$—" or "$(C_3-C_6)$—" and the like refer to compounds containing 3 to 12 carbon atoms and 3 to 6 carbon atoms, respectively.

As used herein, mesh particle size refers to the particle size of a material that results from the sample passing through a sieve of that mesh size. For example, defatted soy flour milled so that it passes through a 43 micron mesh (325 mesh) is referred to as having a 43 micron mesh particle size.

As used herein, unless otherwise indicated, the term "viscosity" refers to viscosity as measured on a DV-III Ultra LV Brookfield viscometer at 6 rpm using spindle #31 with sample temperature maintained at a constant 25° C.

Unless otherwise indicated, the term "Protein Dispersibility Index" (PDI) refers to a means of comparing the dispersibility of a protein in water in which a sample of a soybean material is ground, mixed with a specified quantity of water, and then blended at a specific rpm for a specified time. The resulting mixture and whole soybean flour then have their protein nitrogen content measured using a combustion test, and the PDI is calculated as the percentage of the protein nitrogen concentration in the mix divided by the percentage in the whole soybean flour. A PDI of 100 therefore indicates total dispersibility of the protein present in the soy flour. The total solubility of a given flour may be less than the PDI, and is inversely proportional to the carbohydrate content. The PDI can be affected, not only by the type of soybean used, but also by manufacturing processes; for example, heat treatment has been shown to lower the PDI.

According to the present invention, defatted soy flour comprises about 51-95%, or 51-90% weight percent of the total solids in the binder, preferably 60-95%, or 60-90%, more preferably 75-95% or 75-90%, and most preferably 75-85%, with the remainder being comprised primarily of one or more emulsion (co)polymer. Defatted soy flour as supplied is insoluble in water, but an aqueous dispersion can be obtained either by high shear grinding, preferably in the presence of a dispersant, or by pre-cooking or denaturing the soy protein.

Suitable defatted soy flour starting materials may have PDI values of, for example, 20, 70, and 90.

Suitable defatted soy flour materials may be commercially available or they may be made from ground whole beans (including the hulls, oil, protein, carbohydrate, minerals, etc.), or meal (extracted or partially extracted). As used herein, "flour" includes within its scope defatted soy flour, soy protein concentrate (partially processed flour containing approximately 60-70% protein, less than about 0.5 wt. % oil and approximately 10-20 wt. % carbohydrate), and soy protein isolate (highly processed and substantially pure protein flour containing less than about 0.5 wt. % oil and less than about 5 wt. % carbohydrate). As used herein, the term "defatted soy flour" refers to soy material containing >20 wt. % carbohydrate, while still referring to a flour where the oil has been removed ("defatted") to levels below 1.5 wt. %.

In the present invention, a soy flour having a mesh size of 43 microns (325 mesh) is preferred, and a mesh size of 400 or higher is most preferred. Larger particles are undesirable because the fiber mat effectively filters the large particles and captures them on the surface of the substrate. The desired particle size can be obtained by such techniques as rotapping, ball milling, hammer milling, or rotormilling. Milling techniques crush and further reduce the particle size of the as-supplied material for later use.

To provide a suitable soy-based binder, in a stable homogeneous aqueous dispersion of fine particle size defatted soy flour material at a suitable solids content (from 10% to 25% solids, or higher, in the aqueous dispersion), and at a stable viscosity that allows for facile stirring and transfer through pouring or pumping, the minimally processed grades of soy flour cannot be simply stirred into water to produce such a dispersion. The use of low shear pumps and blending mixers fail to produce commercially useful dispersions. However, suitable dispersions of useful viscosities can be achieved by high shear grinding, which may be provided by any suitable apparatus. Viscosities of approximately 1,000 cps can be attained using a high shear grinding apparatus, such as by grinding using a high shear Cowles dissolver. Other suitable high speed shear apparatus include, but are not limited to: (a) high speed shear impellers or pumps rotating at speeds in the range 1,000-3,500 rpm, preferably 2,000-3,500 rpm, (e.g. TRI-BLENDER by Ladish Company, Tri-Clover Division); (b) homogenizers (e.g. OAKES Mixer by Oakes Machine Corp.); and (c) high speed agitators, mixers, or turbines (e.g. the LIKWIFIER turbine mixer by Lanco and the LIGHTNIN mixers and aerators by Lightnin Co.). Preferably, one or more water-soluble polymer dispersing species is included in the high shear grinding process to attain lower viscosity ranges of approximately 400 to 1,000 cps, preferably up to 600 cps, for the soy flour dispersions, thereby facilitating handling and mixing. Slurries of higher PDI defatted soy flours exhibit much lower viscosities when ground under high shear in the presence of such water soluble polymer dispersing species. The defatted soy flour may be prepared in the form of a slurry prior to combination with the emulsion polymer. When prepared in this manner, the viscosity of the aqueous soy flour slurry is preferably from 100 to 3,000 cps, more preferably 200 to 2,000 cps, or 200 to 1,000 cps, and even more preferably 200 to 800 cps, or 200 to 600 cps.

Water soluble polymer dispersing species may be generated from at least one anionic monomer. Some suitable anionic monomers are, for example, ethylenically unsaturated acid monomers, including, for example, ethylenically unsaturated carboxylic acid monomers, and sulfonic acid monomers. The water soluble polymer dispersing species may optionally include at least one cationic monomer. In some embodiments, the water soluble polymer contains at least one polymerized unit from nonionic monomers (i.e., a monomer that is neither a cationic monomer nor an anionic monomer). Some suitable nonionic monomers include, for example, ethylenically unsaturated nonionic compounds, including compounds with one or more double bond, such as olefins, substituted olefins (including, for example, vinyl halides and vinyl carboxylates), dienes, (meth)acrylates, substituted (meth)acrylates, (meth)acrylamide, substituted (meth)-acrylamides, styrene, substituted styrenes, and mixtures thereof. Further suitable water soluble polymers may be polycarboxy addition (co)polymers which contain at least two carboxylic acid groups, anhydride groups, or salts thereof. Ethylenically unsaturated carboxylic acids may range in amount from about 1% to 100%, by weight, based on the weight of the water soluble polymer.

The water soluble polymer dispersing species may be made by any polymerization method, including, for example, solution polymerization, bulk polymerization, heterogeneous phase polymerization (including, for example, emulsion polymerization, suspension polymerization, dispersion polymerization, and reverse-emulsion polymerization), and combinations thereof, as is known in the art. The molecular weight of such water soluble polymeric species may be controlled by the use of a chain regulator, for example, sulfur compounds, such as mercaptoethanol and dodecyl mercaptan. Typically, the amount of chain regulator, as a percentage by weight based on the total weight of all monomers used, is 20% or less, more commonly 7% or less. The molecular weight of the water soluble polymer is preferably from about 300 to about 100,000, or about 1,000 to 100,000, more preferably 1,000 to 20,000, or 2,000 to 20,000, and even more preferably from 2,000 to 5,000, or from 2,000 to 3,000. For example, the water soluble polymer may be in the form of a solution of the polycarboxy (co)polymer in an aqueous medium such as, for example, a polyacrylic acid homopolymer or an alkali-soluble resin which has been solubilized in a basic medium. Many commercial dispersants and species of similar composition can function as the water soluble polymer. The polymers used as additives in these compositions can be neutralized with a base such as $NH_4OH$ if desired. Suitable commercial dispersants include, for example, ACUMER™ and ACUSOL™ 420N, available from the Rohm and Haas Company (Philadelphia, Pa., USA). The one or more water-soluble polymer species may be used in amounts ranging from 0.1-5%, preferably 0.2-4%, and more preferably 0.5-3%, or 1-2%, based on the weight of the polymeric active ingredient as a percentage of the total weight of the slurry, and functions as a dispersant for the soy flour particles in reducing the viscosity of the slurry. Preferably, the stabilized aqueous soy flour slurry comprises 10-60% defatted soy flour, preferably about 20%, based on the total weight of the slurry, the aqueous slurry being formed by high shear mixing on a Cowles dissolver in the presence of 1-2% of a water soluble polymer, such as ACUSOL™ 420N.

Alternatively, the soybean flour may be prepared by denaturing the protein component of the soy flour, as is known to those skilled in the art, as described in, for example, U.S. Pat. No. 6,306,997. The defatted soy flour may be pre-cooked prior to mixing with the emulsion copolymer; or neutralized with base before or after mixing with the emulsion copolymer, or heated with chemical compounds which denature the protein component of the soy flour. One method for preparing the soy flour slurry includes dissolving sodium bisulfite in water, adjusting the pH to from about 6.8 to 7.1 with sodium hydroxide, heating the solution to from about 45° C. to about 55° C., adding defoamer, and adding dry soy flour under conditions effective to produce the soy slurry. Preferably, the slurry is heated to about 50° C. Addition of sodium bisulfite during preparation of soy flour slurry partially depolymerizes the soy protein by cleaving the disulfide linkages. Cleavage of disulfide bonds reduces the viscosity of the soy slurry. Maintaining the soy flour slurry at the neutral pH and 50° C. obtains a higher solubility of soy flour and avoids protein gelation. Adding defoamers reduces foaming of the soy flour slurry, making preparation of the soy flour slurry easier to handle. Preferred defoamers include cedarwood oil, Byk 024, Sigma antifoam 204, or pine oil. In all of the examples below, the defoamer used is BYK 024 defoamer, available from BYK Chemie USA (Wallingford, Conn., USA). Preparation of soy flour in this manner produces a slurry at a solid content as high as possible and at a viscosity manageable in the subsequent resin formulation.

The emulsion (co)polymer used in the binder of the composite material may comprise, as copolymerized units, ethylenically unsaturated monomers including (meth)acrylic ester monomers such as methyl acrylate, ethyl acrylate, butyl acrylate, 2-ethylhexyl acrylate, decyl acrylate, lauryl acrylate, methyl methacrylate, butyl methacrylate, isodecyl methacrylate, lauryl methacrylate, hydroxyalkyl(meth)acrylate monomers such as 2-hydroxyethyl acrylate, 2-hydroxyethyl methacrylate, 2-hydroxypropyl(meth)acrylate, 2-hydroxybutyl (meth)acrylate, 1-methyl-2-hydroxyethyl(meth)acrylate, and N,N-dimethylaminoethyl(meth)acrylate; as well as the related amides and nitriles, such as (meth)acrylamide or substituted (meth)acrylamides, and acrylonitrile or methacrylonitrile. Other ethylenically-unsaturated nonionic monomers which may be incorporated into the polymer include vinylaromatic compounds, such as styrene or substituted styrenes; ethylvinylbenzene, vinylnaphthalene, vinylxylenes, vinyltoluenes, and the like; butadiene; vinyl acetate, vinyl butyrate and other vinyl esters; vinyl monomers such as vinyl alcohol, vinyl ethers, vinyl chloride, vinyl benzophenone, vinylidene chloride, and the like; allyl ethers; N-vinyl pyrrolidinone; and olefins. Other suitable emulsion (co)polymers may include styrene-acrylic latexes, or all-acrylic latexes, or styrene-butadiene or styrene-acrylonitrile-butadiene latexes. The emulsion (co)polymer used in the binder of the composite material preferably comprises about 5-49%, or 10-49% weight percent of the total solids in the binder, preferably 5-40%, or 10-40%, more preferably 5-25% or 10-25%, and most preferably 15-25%.

The emulsion copolymer used in the binder of the composite material may include, as copolymerized units, ethylenically unsaturated carboxylic acid monomers, or hydroxy monomers, such as (meth)acrylic acid and hydroxyethyl(meth)acrylate. Acrylic acid is the preferred carboxylic acid monomer. In a preferred embodiment the emulsion copolymer used in the binder of the composite material includes, as copolymerized units, from 5% to 40%, or 5% to 30%, or 5% to 25%, or 5% to 15%, preferably from 10% to 30%, or 10% to 20%, or 12% to 20%, most preferably 12% to 17% or 14% to 17%, by weight based on the weight of the emulsion copolymer solids, of a carboxylic acid monomer or hydroxy monomer, such as (meth)acrylic acid and hydroxyethyl (meth)acrylate.

In one embodiment, the latex emulsion (co)polymer of this invention comprises one or more copolymerized multi-ethylenically unsaturated monomers such as, for example, allyl methacrylate (ALMA), allyl acrylate, diallyl phthalate, 1,4-butylene glycol dimethacrylate, 1,2-ethylene glycol dimethacrylate, 1,6-hexanediol diacrylate, butadiene, trimethylolpropane triacrylate (TMPTA) and divinyl benzene. Of these, ALMA, divinylbenzene (DVB), diallyl phthalate, 1,4-butylene glycol dimethacrylate, and 1,6-hexanediol diacrylate are preferred. ALMA is the most preferred. The multi-ethylenically unsaturated monomer can be effectively employed at levels as low as 0.1%, by weight based on the weight of the copolymer, preferably from 0.1 to 10%, or 0.1 to 5%, more preferably from 0.1 to 4%, or 0.2 to 4%, and most preferably from 0.1 to 3%, or 0.2 to 3%, or 0.25 to 3%, or 1.0 to 3%, by weight based on the weight of the copolymer.

The polymer particles of the latex emulsion (co)polymer may optionally contain crosslinking groups that are capable of forming chemical bonds during and after drying of the aqueous polymer composition. The crosslinking groups may be present in the polymer particles as polymerized ethylenically unsaturated monomers containing pendant crosslinking groups, referred to herein as "crosslinking monomers". Crosslinking monomers may include, for example, monomers having alkoxymethyl amide groups, such as, N-methylolacrylamide, N-methylolmethacrylamide, n-butoxymethyl acrylamide, n-butoxymethyl methacrylamide. Such monomers may be employed at levels of 0.1-10 wt. %.

Suitable chain transfer agents such as mercaptans, polymercaptans, and halogen compounds can be used in the polymerization mixture in order to moderate the molecular weight of the emulsion copolymer composition, in the amount of from 0% to 10% by weight, based on the weight of the emulsion copolymer.

Preferably, the emulsion copolymer used in this invention has a Tg of between 0-35° C., preferably 10-20° C., for non-treated substrates having an inherent elongation of greater than 5%, such as spunbond polyester; and between 35-70° C. for non-treated substrates having an inherent elongation of less than 5%, such as glass mat, as measured by differential scanning calorimetry per ASTM 3418/82, midpoint temperature; cell calibration using an indium reference for temperature and enthalpy.

The emulsion copolymer used in this invention has weight average molecular weight of between 5,000 to 2,000,000, preferably between 20,000 and 1,000,000. For applications requiring high performance at elevated temperatures, the emulsion copolymer most preferably has a weight average molecular weight of 100,000 to 1,000,000, however, for some room temperature applications, the molecular weight is most preferably between 30,000 and 600,000.

The binder of this invention may further include a soluble addition (co)polymer, containing at least two carboxylic acid groups, anhydride groups, or salts thereof, referred to herein as a "polyacid". Ethylenically unsaturated carboxylic acids, at a level of at least 70% by weight based on the weight of the soluble addition (co)polymer, may be used. Additional ethylenically unsaturated monomer may include acrylic ester monomers, including methyl(meth)acrylate, ethyl(meth)acrylate, butyl(meth)acrylate, 2-ethylhexyl acrylate, etc. The polyacid may have a molecular weight from about 1,000 to 150,000, and may be used at a level from 0%-30% by weight based on the total weight of solids of the emulsion copolymer.

In one embodiment of the invention, the composition further contains at least one low molecular weight polybasic carboxylic acid, anhydride or salt thereof having a molecular weight of 1000 or less, preferably 500 or less, and most preferably 200 or less. "Polybasic" means having at least two reactive acid or anhydride functional groups. Examples of suitable low molecular weight polybasic carboxylic acids and anhydrides include, for example, maleic acid, maleic anhydride, fumaric acid, succinic acid, succinic anhydride, sebacic acid, azelaic acid, adipic acid, citric acid, glutaric acid, tartaric acid, itaconic acid, trimellitic acid, hemimellitic acid, trimesic acid, tricarballytic acid, 1,2,3,4-butanetetracarboxylic acid, pyromellitic acid, oligomers of carboxylic acid, and the like. When used, preferably, the low molecular weight polybasic carboxylic acid, anhydride or salt thereof is precooked with the soy or lignosulfonate, prior to mixing with the emulsion copolymer. Most preferably, citric acid is used as the polybasic acid.

In another embodiment of this invention, the binder composition further comprises one or more crosslinking agent. The crosslinking agent may be added at a level of 0.3 to 100 equivalents based on equivalents of acid of the emulsion copolymer, and may be selected from, for example, polyols, polyamines or metal ions, where the polyol contains two or more hydroxy groups, and the polyamine contains two or more amine groups. Species containing both hydroxy and amine functionality can also be used. Suitable crosslinkers include glycerol, glycerol derivatives, diethanolamine, triethanolamine, pentaerythritol, hydroxy alkyl urea, urea, oxazoline, polyvinyl alcohol, as well as metal ions such as ions of zirconium or zinc. The compositions should not include hydroxyalkylamides.

In yet another embodiment of this invention, the binder composition comprises a phosphorous-containing accelerator such as those disclosed in U.S. Pat. No. 6,136,916. Preferably, the accelerator is selected from the group consisting of sodium hypophosphite, sodium phosphite, or a mixture thereof. The phosphorous-containing accelerator can also be an oligomer bearing phosphorous-containing groups such as, for example, an oligomer of acrylic acid formed in the presence of sodium hypophosphite by addition polymerization, but a separate compound from any soluble polyacid polymer serving as part of the binder of the curable composition of the present invention. Amounts of the one or more phosphorous-containing accelerator may range from 0 wt. % to 40 wt. %, based on the total weight of binder solids (combined soy and emulsion copolymer solids), such as 0.1 wt. % or more, and up to 25 wt. %, or up to 20 wt. %, or, preferably, up to 15 wt. %, and, more preferably, up to 12 wt. %, all wt. % based on the total weight of binder solids. When the phosphorous-containing accelerator comprises part of an addition (co) polymer or (co)oligomer, the wt. % of the phosphorous-containing accelerator is determined by wt % of the accelerator charged to the reactor as a fraction of the total solids. Other catalyst systems optionally may be used, such as Lewis acids or bases.

In yet still another embodiment, the curable compositions may optionally contain one or more strong acids, wherein the strong acid has a pKa of ≤3.0. The composition may contain up to 0.2 equivalents of a strong acid, relative to the equivalents of total carboxylic acid from the emulsion polymer and the optional soluble polymer, such as from 0.01 to 0.18 equivalents. The strong acid may be a mineral acid, such as, for example, sulfuric acid, or an organic acid, such as, for example, a sulfonic acid. Mineral acids are preferred. The amount of acid, and the method of addition, is regulated such that the emulsion copolymer is not coagulated or otherwise adversely effected.

Preferably, the binder compositions are formaldehyde-free to minimize the formaldehyde content; the aqueous compositions comprise monomers, catalysts, solvents or carriers, and additives which are themselves free from formaldehyde, do not generate formaldehyde during the polymerization process, and do not generate or emit formaldehyde during the treatment of heat-resistant non-wovens.

In a particularly preferred embodiment, the composite material comprises a binder composition of approximately 60-90% by weight, preferably 80%, based on the total weight of binder solids, of defatted soy flour, and an acrylic or styrene-acrylic polycarboxy emulsion copolymer comprising approximately 15% of acrylic acid and approximately 1-3% of allyl methacrylate, based on the weight of the emulsion copolymer. Composite samples 1-3 of Table 9, below, are representative of this embodiment.

The binder of this invention can contain, in addition, conventional treatment components such as, for example, emulsifiers; pigments; fillers or extenders, such as lignosulfonate; anti-migration aids; curing agents; coalescents; surfactants, particularly nonionic surfactants; spreading agents; mineral oil dust suppressing agents; preservatives or biocides, such as isothiazolones, phenolics, or organic acids; plasticizers; organosilanes; anti-foaming agents such as dimethicones, silicone oils and ethoxylated nonionics; corrosion inhibitors, particularly corrosion inhibitors effective at pH<4 such as thioureas, oxalates, and chromates; colorants; antistatic agents; lubricants; waxes; anti-oxidants; coupling agents such as silanes, particularly SILQUEST™ A-187 (manufactured by GE Silicones—OSi Specialties, Wilton, Conn.); polymers not of the present invention; and waterproofing agents such as silicones and emulsion polymers, particularly hydrophobic emulsion polymers containing, as copolymerized units, greater than 30% by weight, based on the weight of the emulsion polymer solids, ethylenically-unsaturated acrylic monomer containing a C5 or greater alkyl group. These components may be simply admixed with the dispersed soy and emulsion (co) polymer dispersion.

The inventive composite material comprises a substrate material chosen from fibers, slivers, chips, particles, and combinations thereof, and a binder composition comprising one or more emulsion copolymer and defatted soy flour. Suitable fibers may be chosen from natural fibers (e.g., sisal, jute, hemp, flax, cotton, coconut fibers, banana fibers); animal fibers (e.g., wool, hair); plastic fibers (e.g., polypropylene fibers, polyethylene fibers, polyvinyl chloride fibers, polyester fibers, such as rayon, polyamide fibers, polyacrylonitrile fibers, polylactic acid fibers, polycaprolactone fibers, and bi-component fiber comprising two or more fiber-forming polymers such as polypropylene and polyethylene terephthalate); glass fibers; glass wool; mineral fibers; mineral wool; synthetic inorganic fibers (e.g., aramid fibers, carbon fibers); and combinations thereof. In some embodiments of the invention, the substrate material is selected from the group consisting of polyester mat, glass reinforcing mat, or microglass based substrate material. Preferably, the fibers are glass fibers or polyester fibers.

In one embodiment of the present invention, the fibers are chosen from heat resistant fibers, such as mineral fibers, aramid fibers, ceramic fibers, metal fibers, carbon fibers, polyimide fibers, polyester fibers, glass fibers, glass wool, mineral wool and combinations thereof. Heat-resistant non-wovens may also contain fibers which are not in themselves heat-resistant such as, for example, nylon fibers, and superabsorbent fibers, in so far as or in amounts such that they do not materially adversely affect the performance of the substrate. Suitable fibers, slivers, chips, particles or particulate matter and combinations thereof, may be chosen from any comprised of metal, metal oxides, plastic, minerals, glass, paper, cardboard, and combinations thereof. In one embodiment, the fibers, slivers, chips, particles or particulate matter and combinations thereof are heat resistant. In another embodiment, methods of the present invention comprise: treating a substrate with a wet binder composition, followed by removing excess binder composition from the substrate, and curing or drying the binder composition on the substrate. The binder can be applied to the substrate by any suitable means including, for example, air or airless spraying, padding, saturating, roll coating, curtain coating, beater deposition, coagulation or dip and squeeze application. To remove excess binder, the resultant saturated wet web may be run over one or more vacuum boxes to remove enough binder to achieve the desired binder content in the mat. Preferably, the binder is applied to the web on a moving screen. The binder level in the inventive mats can range from about 10 to about 40 wt. percent of the finished dry mat, preferably about 15 to about 30 wt. percent and, most preferably, from about 20 to about 30 wt. percent, such as about 25±3 wt. percent. The binder composition is curable or dried by the application of heat.

The binders of this invention are useful to bind non-woven webs, among other things. "Non-woven web(s)" refers to any article or sheet-like form made from natural and/or synthetic fibers, including porous films prepared by the action of chemical or mechanical processing (e.g., apertured films), paper and paper products. One skilled in the art understands that formation of some order occurs during the web forming process (primarily in the machine direction). Manufacturing processes for making non-woven webs are well known in the art. These include, for example, wet-laid, air-laid (dry laid), spunbond, spunlace, meltblown and needle punch. Particularly suitable webs will have a base weight (i.e., the weight of the web before any coating or treatments are applied) of less than about 100 grams per square meter (gsm). In another aspect the webs will have a base weight of less than about 20 gsm.

The soy binder may be cooked before application onto the substrate, and the other binder ingredients may be either mixed with the cooked soy before or after application of the soy to the substrate. Preferably, a jet cooker is employed where the soy is cooked and spray-dried onto the substrate.

In drying (if applied in aqueous form) and curing the binder compositions, the duration, and temperature of heating, will affect the rate of drying and the ease of processing or handling the treated substrate, as well as the property development of the resulting composite. Suitable heat treatment at 100° C. or more, and up to 400° C., may be maintained for from 3 seconds to 15 minutes. Preferably, heat treatment temperatures range 150° C. or higher; such preferred heat treatment temperatures may range up to 225° C., or, more preferably, up to 200° C. or, when using one or more phosphorous-containing accelerator, up to 150° C.

Drying and curing can be done in two or more distinct steps, if desired. For example, the curable composition can be first heated at temperatures and for times sufficient to substantially dry, but not to substantially cure the composition, followed by heating for a second time, at higher temperatures and/or for longer periods of time, to effect curing. Such procedures, referred to as "B-staging," can be used to provide binder-treated non-wovens, for example, in roll form, which can be cured later, with or without forming or molding into a particular configuration, concurrent with the curing process.

Some non-woven fabrics are used at temperatures substantially higher than ambient temperature such as, for example, glass fiber-containing non-woven fabrics which are impregnated with a hot asphaltic composition pursuant to making roofing shingles or roll roofing material. When a non-woven fabric is contacted with a hot asphaltic composition at temperatures of from 150° C. to 250° C., the non-woven fabric can sag, shrink, or otherwise become distorted. Therefore, non-woven fabrics which incorporate a curable composition should substantially retain the properties contributed by the cured aqueous binder composition such as, for example, tensile strength. In addition, the cured composition should not substantially detract from essential non-woven fabric characteristics, as would be the case, for example, if the cured composition were too rigid or brittle or became sticky under processing conditions. The composites described herein find utility in many varied applications, particularly in glass mats for roofing shingles and glass mats for flooring.

EXAMPLES

These examples illustrate specific binder compositions of this invention and ones that compare to such compositions. The following abbreviations are used in the Examples:
SLS—sodium lauryl sulfate
MMA—methyl methacrylate
BA—butyl acrylate
EA—ethyl acrylate
ALMA—allyl methacrylate
AA—acrylic acid
MAA—methacrylic acid
MOA—methylol acrylamide
STY—styrene
DI water—deionized water The preparations and test procedures are carried out at room temperature and standard pressure unless otherwise indicated.

Examples 1-6

Emulsion Copolymer Synthesis

A 5-liter round-bottom flask equipped with a paddle stirrer, thermocouple, nitrogen inlet, and reflux condenser was charged with 876.4 grams of deionized water, 24.2 grams of sodium hypophosphite monohydrate, 28.5 grams of a sodium lauryl ether sulfate surfactant solution (30%), 3.1 grams of sodium hydroxide, and 0.058 grams of an inhibitor. The mixture was heated to 79° C.

For Example 1, a monomer emulsion was prepared using 459.7 grams of deionized water, 89.2 grams of a sodium lauryl ether sulfate surfactant solution (30%), 553.9 grams of butyl acrylate, 969.7 grams of styrene, and 268.9 grams of acrylic acid. A 97.0 gram aliquot of this monomer emulsion was added to the reaction flask, with stirring, followed by a solution of 7.4 grams of ammonium persulfate dissolved in 33.3 grams of deionized water. After an exotherm and while maintaining a reaction temperature of 85° C., the monomer emulsion and a separate solution of 7.4 grams of ammonium persulfate in 156.9 grams of deionized water were gradually added over a total time of 130 minutes. After these additions were complete a solution of 42.6 grams of sodium hydroxide dissolved in 397.4 grams deionized water was added. A solution of 0.022 grams of ferrous sulfate heptahydrate in 4.8 grams deionized water and a solution of 0.022 grams of ethylene diamine tetraacetate, tetra sodium salt, dissolved in 4.8 grams of deionized water was added to the reaction mixture. A solution of 7.9 grams of aqueous tert-butylhydroperoxide (70%) diluted with 31.2 grams deionized water and a solution of 5.3 grams of sodium bisulfite dissolved in 62.8 grams of deionized water were gradually added to the reaction mixture. After a 15 minute hold, a solution of 7.9 grams of aqueous tert-butylhydroperoxide (70%) diluted with 31.2 grams deionized water and a solution of 5.3 grams of sodium bisulfite dissolved in 62.8 grams of deionized water were gradually added to the reaction mixture. After addition of these solutions was complete, 47.6 grams of deionized water was added, and the reaction mixture was cooled to room temperature. When the reaction mixture was cool, a biocide was added and the latex was filtered through a 100 mesh sieve. Examples 2-6 followed the same procedure, but with the monomer emulsions prepared as shown in Table 1.

The resulting latexes had a solids content of roughly 46.0%. The emulsion copolymers of Example 1-6 had Tg as shown in Table 1.

TABLE 1

Monomer Emulsion Recipes for Latex Samples 1-6 (weights in grams), and Copolymer Tg

| | Example 1 | Example 2 | Example 3 | Example 4 | Example 5 | Example 6 |
|---|---|---|---|---|---|---|
| Deionized water | 459.7 | 510.0 | 456.8 | 456.8 | 456.8 | 510.0 |
| Sodium lauryl ether sulfate surfactant (30%) | 89.2 | 90.7 | 88.7 | 88.6 | 113.4 | 90.7 |
| Butyl acrylate | 553.9 | 953.3 | 1072.3 | 1072.3 | 1021.5 | 948.7 |
| Styrene | 969.7 | 596.1 | 423.9 | 388.3 | 715.13 | 575.0 |
| Acrylic acid | 268.9 | 273.3 | 267.2 | 267.2 | 26.72 | 32.1 |
| Allyl methacrylate | 0.0 | 0.0 | 17.8 | 53.4 | 17.81 | 18.1 |
| Copolymer Tg (° C.) | 55 | 20 | 10 | 10 | 10 | 10 |

Example 7

Emulsion Copolymer Synthesis

A 2-liter, four necked round bottom flask, equipped with a condenser, thermocouple and overhead stirring, was loaded with a mixture of 405.0 g of deionized water, 105.0 g of acrylic latex of particle diameter 58 nm and 3.0 g of ammonium persulfate at 85° C. A monomer emulsion was prepared using 125.0 grams of deionized water, 20.0 grams of a sodium lauryl ether sulfate surfactant solution (30%), 258.0 grams of butyl acrylate, 282.0 grams of methyl methacrylate, and 60.0 grams of acrylic acid. With the initial charge stirring at 85° C. the monomer emulsion and a solution of 3.0 g of ammonium persulfate in 66.0 g of deionized water were gradually added to the reaction flask over 120 minutes while maintaining the temperature at 85-87° C. After the addition of the monomer emulsion and ammonium persulfate solution was complete the reaction mixture was held at 85° C. for 15 minutes. The reaction flask was then cooled to 70° C. A solution of 1.40 g of 0.15% ferrous sulfate heptahydrate (aq.) was added with 10.0 g of deionized water. As the reaction mixture cooled a solution, of 1.0 g of isoasorbic acid in 10.0 g of deionized water and a solution of 1.40 g of tert-butyl hydroperoxide (70%) in 10.0 g of deionized water gradually added over 30 minutes. The reaction mixture was then allowed to cool to below 30° C. and was filtered. The resulting latex had a solids content of approximately 46% and the copolymer had a Tg of 30° C.

Example 8

Preparation of Aqueous Admixture of Urea Formaldehyde (UF) Resin and Latex Emulsion Polymer An aqueous admixture with a UF/latex blend weight ratio of 9:1, at 20% solids, i.e. 9 weight parts UF resin solids per 1 part latex solids in 40 parts of water, is prepared.

In Table 2 below, comparative binders Samples 2-4 comprise UF resin alone (SU-100 or FG-472X, from Hexion Specialty Chemicals, Columbus, Ohio, USA). These control samples demonstrate the properties of the UF resin without any latex polymer modifier. The comparative Sample 23 is an aqueous admixture, as described above, of UF resin FG-472X and a latex emulsion copolymer Polymer B (Table 2).

Example 9

Preparation of Aqueous Slurry of Defatted Soy Flour

A stable aqueous soy flour slurry comprising 20% defatted soy flour, based on the total weight of the slurry, is used in the Examples unless otherwise indicated. The aqueous soy flour slurry used herein employs a soy flour of particle size equal to or smaller than that corresponding to 43 micron mesh particle size (325 mesh), and the slurry is formed by high shear mixing on a Cowles dissolver in the presence of 1-2%, based on the weight of the polymeric active ingredient as a percentage of the total weight of the slurry, of a water soluble polymer, such as ACUSOL™ 420N. The latter is available from the Rohm and Haas Company (Philadelphia, Pa., USA). ACUSOL™ is a trademark of the Rohm and Haas Company (Philadelphia, Pa., USA). This type of slurry is stable to settling, has a viscosity that is convenient for use, approximately 400-600 cps, and has minimal viscosity drift.

Example 10

Procedure for Denaturing Defatted Soy Flour

An aqueous slurry of defatted soybean flour, which contains about 54 percent protein, 30 percent carbohydrates, 6 percent ash, and 10 percent moisture, was prepared by dissolving in 250 ml water 1.25 g sodium bisulfite ($NaHSO_3$) for each 100 grams of moisture-free soy flour to be added. The pH was then adjusted to neutral with 50% aqueous sodium hydroxide (NaOH) solution. The solution was heated to and maintained at 50° C., followed by the addition of 1.00 g BYK 024 defoamer, available from BYK Chemie USA (Wallingford, Conn., USA). Subsequently, 100 grams of dry soy flour was slowly added with vigorous stirring, resulting in a viscous but smooth and homogenous slurry. Again, the soy flour used has a particle size equal to or smaller than that corresponding to 43 micron mesh particle size (325 mesh).

Alternative methods to denature the soy protein were explored, using sodium hydroxide solution alone, or using sodium carbonate (see Table 2). However, the combination of sodium hydroxide and sodium bisulfite is preferred for ease of handling.

For the embodiment that contemplates addition of a polybasic carboxylic acid, anhydride or salt thereof, anhydrous citric acid (11.1 grams) is weighed into the same container along with the defatted soy flour (100.0 grams), and the dry mixture is then added to the stirring water secured in the heated water bath. The procedure is otherwise as described above. This embodiment can also be adapted for use with the aqueous soy flour slurry described in Example 9 above, employing the procedure and corresponding ratio of polybasic carboxylic acid (or anhydride, or salt thereof) used therein.

Example 11

Glass Mat Preparation Procedure and Test Procedures

To prepare the mats used in the examples that follow, glass fiber non-woven handsheets are prepared with Johns Manville 137 Standard, 3.2 cm (1¼ inch) length, sized glass chop using approximately 7.6 grams of glass fiber per sheet (0.82 kg per 9.3 square meters; 1.8 pounds per 100 square feet). The glass fiber is dispersed in water using SUPERFLOC™ A-1883 RS (Cytec Industries Incorporated, West Paterson, N.J., USA), an anionic polyacrylamide water-in-oil emulsion, and RHODAMEEN™ VP-532 SPB (Rhodia Chemical Company, Cranbury, N.J., USA), an ethoxylated fatty amine cationic dispersing agent. Handsheets are formed in a Williams (Williams Apparatus Company, Watertown, N.Y., USA) handsheet mold. The wet sheets are transferred to a vacuum station and de-watered. The aqueous binder compositions described below are prepared and each is applied to a de-watered sheet and the excess is vacuumed off. The sheets are dried/cured in a forced air oven for 2½ minutes at 200° C. The binder amount on the samples is 21% LOI (loss on ignition).

Determination of LOI (Loss on Ignition)

A 6.4 cm by 7.6 cm (2.5 inch by 3 inch) piece of dried/cured fiberglass mat was cut. The sample was weighed and then placed in a muffle furnace at 650° C. for 2 minutes. The sample was removed and then reweighed. % LOI was calculated using the equation:

% LOI=(weight before burning−weight after burning)×100/weight before burning.

Tensile Strength Testing

Handsheets are cut into 2.54 cm by 12.7 cm (1 inch by 5 inch) strips for tensile testing and cut for tear testing. Tensile testing is performed on seven strips from each sample using a Thwing-Albert INTELLECT 500 tensile tester (Thwing-Albert Instrument Co., West Berlin, N.J., USA) with a 90.7 kg (200 lb.) cell, 2.54 cm/min (1 inch/min) jaw speed, 20% sensitivity, and a 7.6 cm (3 inch) gap. Dry tensile is performed on the prepared strips. All tensile values are reported in Newtons (N).

Elmendorf Tear Strength Testing

Elmendorf tear strength is determined on cut samples of dried/cured handsheet which are 6.4 cm by 7.6 cm (2.5 inches by 3 inches). A single ply sample is placed in a Thwing-Albert Tear Tester with a 1600 g tear arm. The sample is notched with a 1.9 cm (0.75 inch) cut and the arm is released. The tear strength is recorded in grams (grams force).

Example 12

Rapid Screening Test Method

Binder formulations were rapid tested by applying to pre-formed glass fiber mats (DURA-GLASS® Unbonded HEC Mat 3/4K117 from Johns Manville). The binder is made up to bath solids, typically 8%-13%, and poured in a stainless steel tray; the pre-formed glass fiber mat is cut into a sheet measuring 28 cm by 33 cm (11" by 13"). The pre-formed mat is then immersed in the binder bath just under the surface until completely wetted with the binder. The soaked mat is then transferred to the vacuum station and the excess binder vacuumed in a similar manner to hand sheets described earlier. The mat is then cured and tested as described in the hand sheet preparation method described previously.

Only the compositions and data presented in Tables 2 and 3 are studied by the rapid screening test method described here. All other compositions and data are prepared and tested as described in Example 11.

TABLE 2

Composition and Preparation of Binder Component of the Composites Used in Rapid Screening Test

| Sample No. | Binder[1] | Additive[2] | Preparation[3] | Cure Conditions | Modifier[4] |
|---|---|---|---|---|---|
| 1 | Starch flour | — | starch cooked | 200° C., 3 m | — |
| 2 | SU-100[5] | — | — | 190° C., 3 m | — |
| 3 | SU-100[5] | — | — | 200° C., 3 m | — |
| 4 | FG-472X[5] | — | — | 200° C., 3 m | — |
| 5 | Soy 7B[6] | — | soy cooked | 150° C., 3 m | — |
| 6 | Soy 7B | NaOH, 10% | soy cooked | 150° C., 3 m | — |
| 7 | Soy 7B | Na$_2$CO$_3$, 27% | soy cooked | 150° C., 3 m | — |
| 8 | Soy 7B | NaOH, 10% | — | 150° C., 3 m | — |
| 9 | Soy 7B | NaOH, 7% | soy cooked | 150° C., 3 m | — |
| 10 | ARBO A02[7] | — | — | 150° C., 3 m | — |
| 11 | ARBO A02[7] | — | — | 165° C., 4 m | — |
| 12 | ARBO S01[7] | — | — | 155° C., 4 m | — |
| 13 | 50/50 Soy 7B/ARBO S01 | — | — | 155° C., 4 m | — |
| 14 | 50/50 Soy 7B/ARBO A02 | — | — | 155° C., 4 m | — |
| 15 | 50/50 Soy 7B/ARBO S01 | — | soy cooked | 155° C., 4 m | — |
| 16 | 50/50 Soy 7B/ARBO A02 | — | soy cooked | 155° C., 4 m | — |
| 17 | 50/50 Soy 7B/ARBO A02 | NaOH | cooked together | 155° C., 4 m | — |
| 18 | 50/50 Soy 7B/ARBO A02 | — | soy cooked | 155° C., 4 m | — |
| 19 | Soy 7B | NaOH | soy cooked | 155° C., 4 m | Polym. A (20%) |
| 20 | 50/50 Soy 7B/ARBO A02 | NaOH | soy cooked | 155° C., 4 m | Polym. A (20%) |
| 21 | ARBO A02 | — | — | 155° C., 4 m | Polym. A (40%) |
| 22 | Soy 7B | NaOH | soy cooked | 155° C., 4 m | Polym. B (20%) |
| 23 | FG-472X[5] | — | — | 200° C., 3 m | Polym. B (10%) |

[1]20 wt. % aqueous slurry or solution.
[2]Where indicated, levels are based on weight percent of solid sodium hydroxide (NaOH) or sodium carbonate (Na$_2$CO$_3$) based on dry weight of soy flour; otherwise NaOH is added to achieve slurry pH of 8.0.
[3]All slurries were prepared by first mixing on a benchtop mechanical stirrer at high speed to achieve a stable vortex; additionally, where indicated, "soy cooked" refers to the soy slurry further heated to 65° C. for 30 minutes, "cooked together"refers to all components of the "Binder" (soy and lignosulfonate) mixed together then cooked together by heating to 65° C. for 30 minutes.
[4]The emulsion copolymer, Polymer A, is EA/MMA/(5% or less) of MOA, and Polymer B is MMA/(5% or less) of MOA and MAA. The amount of copolymer modifier is shown (in parentheses) as a weight percentage of the combined soy/copolymer binder solids.
[5]SU-100 and FG-472X are commercial urea-formaldehyde (UF) resin binders available from Hexion Specialty Chemicals, Columbus, OH, USA.
[6]Soy 7B is Nutrisoy 7B, a defatted soy flour (supplied as 135 micron, equivalent to 100 mesh; 80-90 PDI), available from Archer Daniels Midland Company (Decatur, Illinois, USA), further rotapped through 43 micron (325 mesh) before use.
[7]Lignosulfonates ARBO A02 and ARBO S01 are the ammonium salt and sodium salts of lignosulfonate, respectively, obtained from Tembec (Temiscaming, Quebec, Canada).

TABLE 3

Tear Strength and Tensile Strength for Composite Samples 1-23 prepared by Rapid Screening Method

| Sample No. | Binder/Modifier[1] | Tear Strength[2] (g) | Dry Tensile[2] (N) | LOI |
|---|---|---|---|---|
| 1 | Starch flour | 250 | 93.4 | 23% |
| 2 | SU-100 | 220 | 103.6 | 20% |
| 3 | SU-100 | 215 | 99.2 | 24% |
| 4 | FG-472X | 214 | 98.3 | 24% |
| 5 | Soy 7B | 436 | 52.5 | 18% |
| 6 | Soy 7B | 384 | 95.6 | 22% |
| 7 | Soy 7B | 383 | 49.4 | 25% |
| 8 | Soy 7B | 334 | 83.6 | 19% |
| 9 | Soy 7B | 386 | 104.1 | 22% |
| 10 | ARBO A02 | 297 | 30.7 | 19% |
| 11 | ARBO A02 | 238 | 27.1 | 19% |
| 12 | ARBO S01 | 329 | 44.9 | 17% |
| 13 | 50/50 Soy 7B/ARBO S01 | 430 | 59.6 | 20% |
| 14 | 50/50 Soy 7B/ARBO A02 | 391 | 64.1 | 24% |
| 15 | 50/50 Soy 7B/ARBO S01 | 383 | 67.2 | 22% |
| 16 | 50/50 Soy 7B/ARBO A02 | 371 | 67.6 | 23% |
| 17 | 50/50 Soy 7B/ARBO A02 | 246 | 46.3 | 21% |
| 18 | 50/50 Soy 7B/ARBO A02 | 295 | 44.0 | 18% |
| 19 | Soy 7B/Polym. A | 362 (282) | 126.8 (98.8) | 27% |
| 20 | Soy 7B/ARBO A02/Polym. A | 378 | 56.9 | 18% |
| 21 | ARBO A02/Polym. A | 280 | 43.1 | 14% |
| 22 | Soy 7B/Polym. B | 282 (191) | 117.0 (79.2) | 31% |
| 23 | FG-472X/Polym. B | 172 | 117.4 | 25% |

[1]The binder/modifier notations, and the additive, preparation and cure conditions, are the same as in Table 2.
[2]Tear and tensile data in parentheses indicate the experimental number normalized to the target LOI of 21%.

Composite Samples 1-3 (Table 2) illustrate that commercial UF resins, SU-100 and FG-472X, show similar tear and dry tensile properties when used as binders in glass mat composites, comparable to properties attained using starch flour as the binder.

Sample 5 (Soy 7B) demonstrates that the use of Soy 7B in the binder can significantly boost the tear strength of the composite (approximately double), but with significant loss in dry tensile strength (see sample 5: approximately half the tensile strength of samples 1-4). Sample 6 shows that loss in tensile strength is essentially recovered, and most of the tear strength retained, if the Soy 7B is neutralized with sodium hydroxide (e.g. Sample 6). Neutralization with sodium carbonate, however, is ineffective in recovering the loss in dry tensile strength (Sample 7).

Samples 10-12 show that composites in which lignosulfonate is the sole binder have generally low tensile strength. The use of 50/50 soy:lignosulfonate binders is explored in Samples 13-18. Although good tear strength results from this combination, the dry tensile strength is lacking compared to composites comprising current commercial UF resin binders.

Samples 19-23 show the use of an emulsion copolymer added as a minor component of the binder in soy and lignosulfonate binder systems. The data indicate that acrylic emulsion copolymers can be used as a binder modifier in these systems to obtain a favorable balance of properties.

TABLE 4

Mechanical Properties of Soy Composites

| Sample | Binder[1] | Preparation[2] | Modifier | Tear (g) | Tensile (N) | LOI |
|---|---|---|---|---|---|---|
| 1 | 70 PDI[1] | Ball milled 24 hr[3] | — | 742 | 66.7 | 18% |
| 2 | Soy 7B[4] | Ball milled 5 hr | — | 670 | 64.1 | 20% |
| 3 | Soy 7B | Ball milled 5 hr | Ex. 1 + TEA[5] | 764 | 101.0 | 21% |
| 4 | Soy 7B | Ball milled 5 hr | SBR[6] | 827 | 127.2 | 22% |

[1]PROLIA ™ 200/70 (defatted soy flour supplied as 200 mesh (74 micron) and PDI of 70 from Cargill, Inc., Minneapolis, MN), ball milled to obtain particle size of 325 (43 micron) mesh.
[2]Hammer milled samples of 1-4 did not make useable mats (the add-on, or LOI, is too high, and moreover, streaking occurs on the sheets due to clumped particles in the soy dispersion). Ball milling to provide a soy dispersion with low enough particle size to make suitable handsheet composites (with no streaks).
[3]In sample 1, the 70 PDI ball milled sample had to be ground on the Cowles high shear mixer to break up clumps.
[4]NUTRISOY 7B, a defatted soy flour (135 micron (100 mesh); 80-90 PDI), available from Archer Daniels Midland Company (Decatur, IL), ball milled to 43 micron (325 mesh).
[5]Emulsion copolymer described in Example 1, at 20 wt. % of the combined soy/copolymer binder solids, additionally contains 0.65 equivalents, based on acid content of the emulsion copolymer, of triethanolamine (TEA) as a crosslinker.
[6]A commercial styrene-butadiene resin, Dow 6620, from Dow Chemical Company (Midland, MI).

As shown in Table 4, above (Samples 1 and 2), in the absence of emulsion copolymer modifier, the two sources of soy do not result in appreciable differences in tear strength and dry tensile strength of the composite. Notably, the tensile strength is deficient in both samples. The copolymer modifier, added such that it is present in the amount of 20% of the solids of the combined soy/copolymer binder solids, greatly improves the dry tensile strength of the resulting composite (Samples 3 and 4). Comparison of Samples 2 and 3 (or 2 and 4) thus shows that the emulsion polymer can significantly improve the properties of the soy binder in glass composite mats.

TABLE 5

Effect of Glycerol as Crosslinker on Mechanical Properties of Soy Composites

| Sample | Binder[1] | pH[2] | Modifier[3] | Tear[4] (g) | Tensile[4] (N) | LOI |
|---|---|---|---|---|---|---|
| 1 | 70 PDI | 6.7 | — | 535 (509) | 609 (58.1) | 22% |
| 2 | 70 PDI | 6.7 | 2% Glycerol | 569 (502) | 65.4 (57.2) | 24% |
| 3 | 70 PDI | 6.7 | Ex. 1 | 877 (705) | 142.8 (115.3) | 26% |
| 4 | 70 PDI | 6.7 | Ex. 1 + 1eq Glycerol | 800 (696) | 124.1 (108.6) | 24% |
| 5 | 70 PDI | 6.7 | Ex. 1 + 0.5eq Glycerol | 935 (818) | 107.2 (93.8) | 24% |
| 6 | 70 PDI | 8.0 | — | 841 (729) | 100.5 (88.0) | 24% |
| 7 | 70 PDI | 8.0 | — | 756 (742) | 85.0 (85.0) | 21% |
| 8 | 70 PDI | 8.0 | 2% Glycerol | 780 (745) | 100.1 (95.5) | 22% |
| 9 | 70 PDI | 8.0 | Ex. 1 | 910 (896) | 96.5 (96.5) | 21% |
| 10 | 70 PDI | 8.0 | Ex. 1 + 1eq Glycerol | 628 (610) | 75.2 (71.8) | 22% |

[1]The soy flour is PROLIA ™ 200/70 (see Table 4, footnote 1).
[2]In samples 1-5 the binder pH is 6.7. Samples 6-10 were adjusted to a pH of 8.0 using sodium hydroxide solution.
[3]The modifier from Ex. 1 is added at 20 wt. % of the combined soy/copolymer binder solids. In Samples 4, 5, and 10, the amount of glycerol added is the number of equivalents based on equivalents of acid in the emulsion copolymer. Samples 2 and 8 are non-latex containing controls for Samples 4, 5, and 10, wherein, the amount of glycerol is 2% solids on total slurry solids, which is an equal solid weight amount to that used in the latex-containing samples.
[4]Tear and tensile data in parentheses indicate the experimental number normalized to the target LOI of 21%.

The experimentally obtained LOI varies slightly in Table 5, such as between the data obtained at pH 6.7 and that obtained at pH 8.0. Data normalized to be equivalent to the target LOI of 21% (i.e. comparing equal binder add-on), shows that the addition of glycerol as a crosslinker, at either pH, has very little effect on the mechanical properties for the composites for which soy is the sole binder, and may even detract from tensile strength in the composites comprising the soy/copolymer binder system.

As shown in Table 5 (comparison of Samples 6 and 7 vs. Sample 1), higher pH has a positive effect on the mechanical properties of composites for which soy is the sole binder, but again detracts from tensile strength in the composites comprising the soy/copolymer binder system (compare Sample 9 vs. Sample 3).

TABLE 6

Effect of Soy Flour PDI and Slurry Processing on Mechanical Properties of Soy Composites

| Sample | Binder[1] | Soy Processing | Modifier | Tear (g) | Tensile (N) | LOI |
|---|---|---|---|---|---|---|
| 1 | 20 PDI | — | — | 732 | 78.3 | 22% |
| 2 | 20 PDI | — | Ex. 2 | 786 | 92.5 | 20% |
| 3 | 20 PDI | — | Ex. 1 | 771 | 93.9 | 19% |
| 4 | 20 PDI | NaHSO$_3$/NaOH[2] | Ex. 1 | 767 | 88.5 | 20% |
| 5 | 70 PDI | — | Ex. 7 | 718 | 91.2 | 20% |
| 6 | 70 PDI | NaHSO$_3$/NaOH | Ex. 1 | 718 | 86.3 | 21% |
| 7 | 90 PDI | — | Ex. 1 | 885 | 85.9 | 22% |
| 8 | 90 PDI | NaHSO$_3$/NaOH | Ex. 1 | 1009 | 99.2 | 19% |

[1]The soy flours are defatted soy flours, supplied as 74 micron particle size (200 mesh) in Samples 1-6 and 135 micron (100 mesh) in Samples 7-8, and then ball milled to 43 micron particle size (325 mesh).
[2]Heating soy material at 50° C. for 1 hour with sodium bisulfite (NaHSO$_3$) and sodium hydroxide (NaOH) as described in Example 10.

Table 6 shows that the soy/copolymer binder can produce composite materials regardless of the PDI of the starting defatted soy flour. The latter was ball milled, as described above. As shown in Sample 8, for ease of processing, the soy can be cooked with sodium bisulfite, which results in improved tear strength and tensile strength.

TABLE 7

Mechanical Properties of Copolymer Modified Soy Composites

| Sample | Binder | Soy Processing | Modifier | Tear (g) | Tensile (N) | LOI |
|---|---|---|---|---|---|---|
| 1 | SU-100[1] | — | — | 511 | 129.9 | 18% |
| 2 | 90 PDI/325[2] | NaHSO$_3$/NaOH[3] | Ex. 3[4] | 1182 | 103.6 | 17% |

[1]Commercial UF resin - see Table 2, footnote 5.
[2]90PDI/325 is defatted soy flour PROLIA™ 90 flakes milled to 43 micron (325 mesh).
[3]The soy was heated at 50° C. for 1 hour with sodium bisulfite and sodium hydroxide as described earlier.
[4]The emulsion copolymer modifier is described in Example 3.

Table 7 shows the mechanical properties for a preferred embodiment of a composite of the invention and is compared to a control composite comprising a commercial UF resin as the binder.

TABLE 8

Effect of Copolymer Modifier on Mechanical Properties of Soy Composites

| Sample | Binder | Modifier | Tear (g) | Tensile (N) | LOI |
|---|---|---|---|---|---|
| 1 | FG-705[1] | — | 454 | 151.2 | 24% |
| 2 | FG-705[1] | 5% Polym. B[2] | 656 | 142.3 | 21% |
| 3 | 20 PDI[3] | — | 535 | 62.3 | 22% |
| 4 | 20 PDI[3] | 20% Ex. 1 | 877 | 142.3 | 26% |

[1]Commercial UF resin binder, pre-modified with a latex emulsion copolymer, available from Hexion Specialty Chemicals, Columbus, OH, USA.
[2]The emulsion copolymer modifier, Polymer B (see Table 2, footnote 4), is added to the UF resin such that the copolymer is 5 wt. % of the combined UF/copolymer binder solids.
[3]The soy flour is PROLIA 200/20 (used as 43 micron mesh particle size, 325 mesh, as described above in Table 6, Footnote 1).

Sample 4 (Table 8) shows that composites comprising the modified soy binder can achieve a desirable property balance. Compared to the control composites comprising the UF resin, Sample 4 displays far superior tear strength, while approximately matching the tensile strength. Although the binder add-on is marginally high for sample 4 (also sample 1, the control), it is clear that the inventive composites provide desirable composites comparable to UF composites.

TABLE 9

Effect of Polymer Modifier Composition on Mechanical Properties of Soy Composites

| Sample | Binder[1] | Modifier[2] | Tear (g) | Tensile (N) | LOI |
|---|---|---|---|---|---|
| 1 | 90 PDI | Ex. 7 | 850 | 135.7 | 20% |
| 2 | 90 PDI | Ex. 4 | 950 | 149.0 | 21% |
| 3 | 90 PDI | Ex. 3 | 825 | 149.0 | 20% |
| 4 | 70 PDI | Ex. 7 | 1027 | 131.2 | 18% |
| 5 | 70 PDI | Ex. 5 | 811 | 109.9 | 20% |
| 6 | 70 PDI | Ex. 6 | 936 | 118.8 | 18% |
| 7 | 70 PDI | 75% Ex. 5/ 25% AQUASET 1734[3] | 657 | 110.3 | 19% |
| 8 | SU-100[4] | — | 498 | 154.3 | 23% |

[1]The soy flours are described above (Table 6);
[2]The emulsion copolymer modifiers are described in Examples 3-7.
[3]Commercial water soluble polyacrylic acid thermoset resin available from Rohm and Haas Company (Philadelphia, PA).
[4]SU-100 is a commercial UF resin described above (Table 2, Footnote 5).

The composites of Table 9 illustrate some preferred embodiments of the invention. The inventive compositions provide inexpensive, formaldehyde-free, composites that retain both flexibility and strength after cure. Compared to the control composites comprising the UF resin, Samples 1-4 display far superior tear strength, while approximately matching the tensile strength, thereby offering a more environmentally friendly product with a desirable property balance.

I claim:

1. A composite material comprising
a substrate material;
that is coated or impregnated with a cured or dried binder composition wherein the cured or dried binder composition is produced from an aqueous binder composition comprising:
i) polymer particles of at least one emulsion (co)polymer, chosen from A) an emulsion (co)polymer that comprises in polymerized form from 5% to 25% by weight, based on the weight of the (co)polymer, of one or more carboxy acid monomer, anhydride thereof, or salt thereof, based on the weight of the (co)polymer, or B) an emulsion (co)polymer that comprises in polymerized form from 0.1 to 5 weight percent of one or more multi-ethylenically unsaturated monomer, based on the weight of the (co)polymer, and
ii) defatted soy flour of no greater than 43 micron mesh particle size;
wherein the composite material comprises ≤40 wt. % cured or dried binder composition; and,
further wherein the binder composition comprises from 51 wt. % to 95 wt. % defatted soy flour, based on the binder composition solids.

2. The composite material of claim 1, wherein the emulsion (co)polymer comprises in polymerized form from 10% to 20% by weight, based on the weight of the (co)polymer, of the one or more carboxy acid monomer.

3. The composite material of claim 1, wherein the emulsion (co)polymer is comprised of from 0.1 to 5 weight percent, based on the weight of the (co)polymer, of the one or more multi-ethylenically unsaturated monomer, in polymerized form.

4. The composite material of claim 3, wherein the one or more multi-ethylenically unsaturated monomer comprises allylmethacrylate.

5. The composite material of claim 1, wherein the protein in the defatted soy flour is denatured or is produced from an aqueous dispersion of the protein including one or more water-soluble polymer dispersing species.

6. The composite material as claimed in claim 5, wherein the denatured protein in the defatted soy flour is denatured with sodium bisulfite.

7. The composite material of claim 1, wherein the aqueous binder composition further comprises lignin or lignosulfonate.

8. The composite material of claim 1, wherein the aqueous binder composition further includes one or more crosslinking agent selected from the group consisting of glycerol, glycerol derivatives, diethanolamine, triethanolamine, pentaerythritol, hydroxy alkyl urea, urea, oxazoline, polyvinyl alcohol, zirconium metal ions, zinc metal ions, and mixtures thereof.

9. The composite material of claim 1, wherein the substrate material is selected from the group consisting of: a polyester mat, a glass reinforcing mat, and a microglass based substrate material.

10. The composite material as claimed in claim 1, wherein the aqueous binder composition is formaldehyde free.

11. A method for producing a composite material, said method comprising:
i) coating or impregnating a substrate material with an aqueous binder composition,
ii) removing excess of the aqueous binder composition from the substrate material, and
iii) curing or drying the aqueous binder composition on the substrate material;
wherein the aqueous binder composition comprises:
a) polymer particles of at least one emulsion (co)polymer that comprises in polymerized form from 5% to 25% by weight, based on the weight of the (co)polymer, of one or more carboxy acid monomer, anhydride thereof, or salt thereof, and
b) defatted soy flour of no greater than 43 micron mesh particle size;
wherein the composite material comprises ≤40 wt. % cured or dried binder composition; and
wherein the cured or dried binder composition comprises from 51 wt. % to 95 wt. % defatted soy flour, based on the binder composition solids.

* * * * *